US012635574B2

(12) United States Patent     (10) Patent No.:   US 12,635,574 B2

Niu et al.     (45) Date of Patent:     May 19, 2026

(54) THREE-DIMENSIONAL STACKED PROCESSING SYSTEMS

(71) Applicant: Alibaba Group Holding Limited, Georgetown (KY)

(72) Inventors: Dimin Niu, Sunnyvale, CA (US); Wei Han, Sunnyvale, CA (US); Tianchan Guan, Shanghai (CN); Yuhao Wang, Sunnyvale, CA (US); Shuangchen Li, Sunnyvale, CA (US); Hongzhong Zheng, Los Gatos, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 369 days.

(21) Appl. No.: 18/027,074

(22) PCT Filed: Sep. 17, 2020

(86) PCT No.: PCT/CN2020/115776

§ 371 (c)(1),
(2) Date: Mar. 17, 2023

(87) PCT Pub. No.: WO2022/056757

PCT Pub. Date: Mar. 24, 2022

(65) Prior Publication Data

US 2023/0326905 A1     Oct. 12, 2023

(51) Int. Cl.
| | |
|---|---|
| *H01L 25/065* | (2023.01) |
| *H01L 23/00* | (2006.01) |
| *H01L 23/498* | (2006.01) |
| *H10B 80/00* | (2023.01) |

(52) U.S. Cl.
CPC .... *H01L 25/0652* (2013.01); *H01L 23/49816* (2013.01); *H01L 23/49827* (2013.01); *H01L 23/49838* (2013.01); *H01L 24/16* (2013.01); *H10B 80/00* (2023.02); *H01L 2224/16146* (2013.01); *H01L 2224/16221* (2013.01); *H01L 2924/1431* (2013.01); *H01L 2924/14361* (2013.01)

(58) Field of Classification Search
CPC ................................................... H01L 25/0652
See application file for complete search history.

(56) References Cited

U.S. PATENT DOCUMENTS

| | | |
|---|---|---|
| 8,274,792 B2 | 9/2012 | Soffer |
| 8,587,340 B2 | 11/2013 | Lin |
| 8,686,549 B2 | 4/2014 | Vorbach |
| 8,729,691 B2 | 5/2014 | Farrar et al. |
| 9,337,138 B1 | 5/2016 | Abugharbieh et al. |
| 9,564,878 B2 | 2/2017 | Lin |
| 11,222,837 B2 | 1/2022 | Collins et al. |
| 11,410,973 B2 | 8/2022 | Fay et al. |

(Continued)

FOREIGN PATENT DOCUMENTS

| | | |
|---|---|---|
| CN | 108090022 A | 5/2018 |
| CN | 110010601 A | 7/2019 |

*Primary Examiner* — William A Harriston

(57) ABSTRACT

Aspects of the present technology are directed toward three-dimensional (3D) stacked processing systems characterized by high memory capacity, high memory bandwidth, low power consumption and small form factor. The 3D stacked processing systems include a plurality of processor chiplets and input/output circuits directly coupled to each of the plurality of processor chiplets.

20 Claims, 3 Drawing Sheets

(56) References Cited

U.S. PATENT DOCUMENTS

| 11,704,271 | B2 | 7/2023 | Duan et al. | |
| 2010/0095088 | A1 | 4/2010 | Vorbach | |
| 2013/0257489 | A1 | 10/2013 | Lin | |
| 2013/0292840 | A1* | 11/2013 | Shoemaker | H01L 25/0657 |
| | | | | 257/773 |
| 2013/0299999 | A1 | 11/2013 | Farrar et al. | |
| 2015/0137866 | A1 | 5/2015 | Lin | |
| 2018/0366442 | A1 | 12/2018 | Gu et al. | |
| 2019/0050325 | A1* | 2/2019 | Malladi | G06F 12/0862 |
| 2020/0235048 | A1 | 7/2020 | Collins et al. | |
| 2021/0118852 | A1 | 4/2021 | Fay et al. | |
| 2022/0058150 | A1 | 2/2022 | Duan | |

* cited by examiner

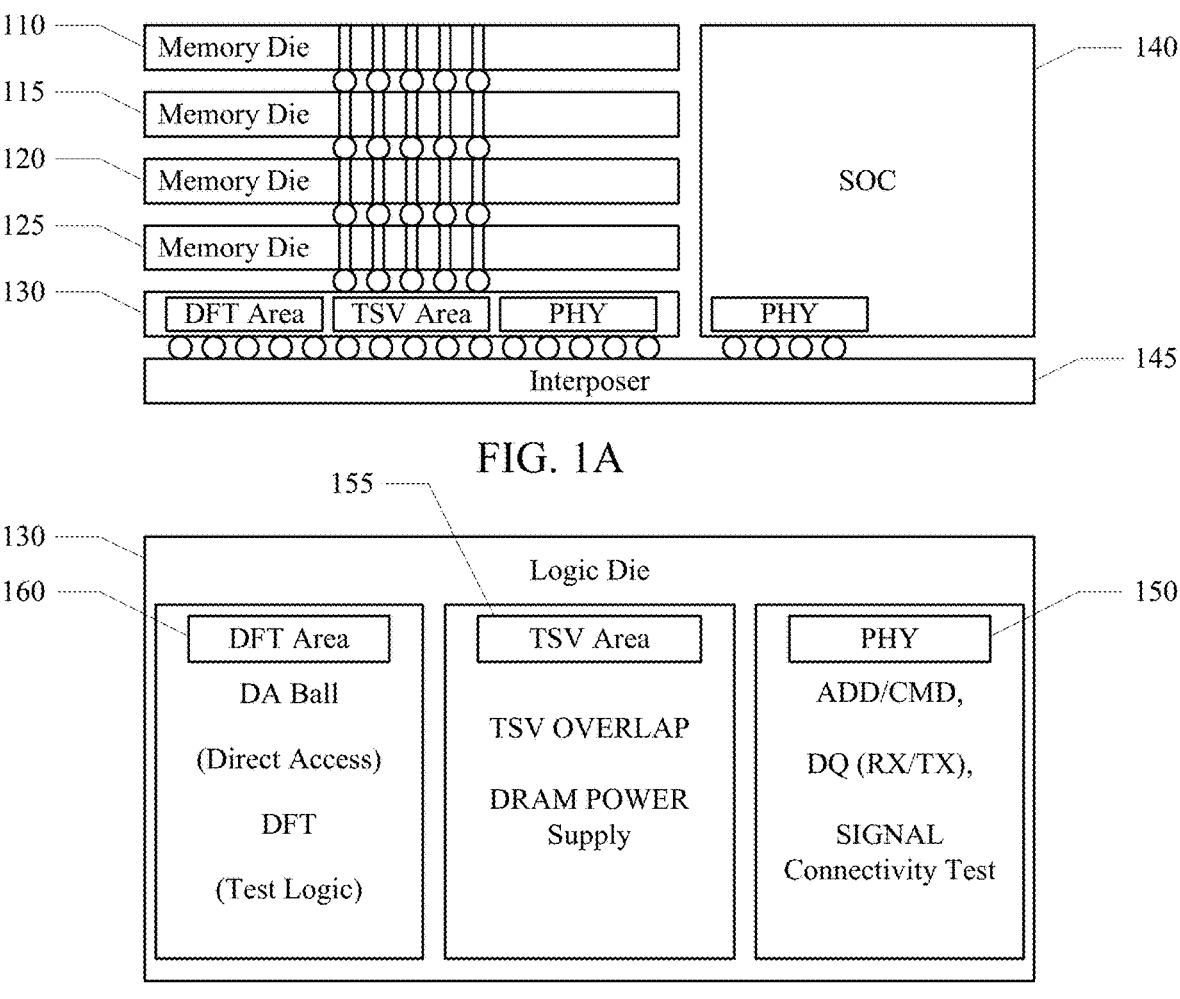
FIG. 1A
FIG. 1B
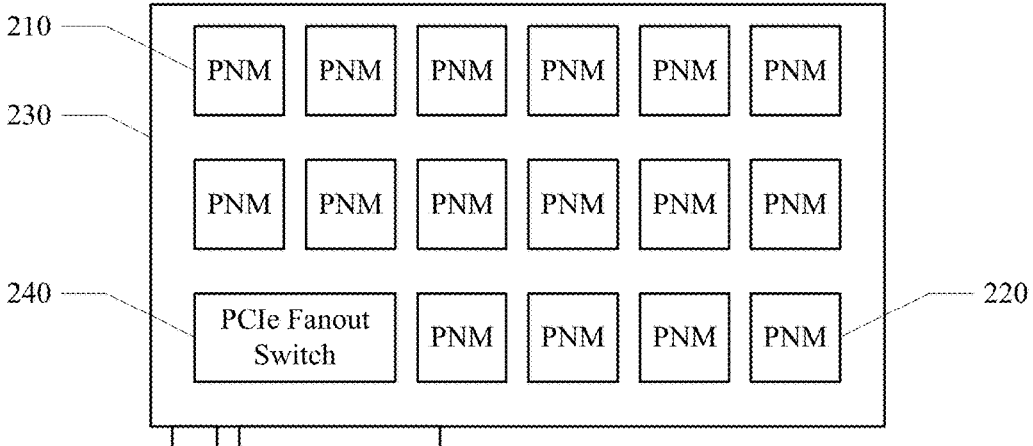
FIG. 2

THREE-DIMENSIONAL STACKED PROCESSING SYSTEMS

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. A number of technologies such as high-end graphics, 40G/100G Ethernet, exascale high-performance computing and the like, need high density memory, high memory bandwidth, and low power consumption solutions.

Referring to FIGS. 1A and 1B, a high bandwidth memory (HBM) based processing near memory (PNM) solution, according to the conventional art, is shown. The HBM PNM solution can include a three-dimensional (3D) stack of memory dice 110-125 along with a logic die 130. The logic die 130 and memory dice 110-125 are the same size and therefore the logic die size is limited by the memory die size. In addition, the memory die manufacturing yield limits the size of the memory dice 110-125 and therefore also limits the die size of the logic die 130.

The 3D stack of memory dice 110-125 and logic die 130 can be integrated with a processing unit or other system-on-chip 140 utilizing an interposer 145. For example, in a conventional 2.5D integration, the 3D stack of memory dice 110-125 and logic die 130 can be integrated with a GPU utilizing an interposer 145.

As illustrated in FIG. 1B, the interposer 145 can provide physical layer (PHY) logic 150 such as address command logic, data (DQ) line transmit and receive logic and signal connectivity test logic. The interposer 145 can also provide through-silicon-via area 155 for coupling power to the memory dice 110-125. The interposer 145 can also provide design for test area 160 including direct access connections.

Referring now to FIG. 2, a plurality of HBM PNMs 210-220 can be further integrated on a printed circuit board (PCB) 230 utilizing a conventional interconnection such as a peripheral card interface express (PCIe) fanout switch 240. However, the conventional HBM PNM solution is characterized by limited memory capacity, limited memory bandwidth, lower power efficiency and large form factor. Accordingly, there is a continuing need for improved high-performance memory and processing solutions.

SUMMARY OF THE INVENTION

The present technology may best be understood by referring to the following description and accompanying drawings that are used to illustrate embodiments of the present technology directed toward processing systems including a plurality of processor chiplets, and input/output circuits directly coupled to each of the plurality of processor chiplets. The processing systems can be characterized by high memory capacity, high memory bandwidth, low power consumption and small form factor.

In one embodiment, a processing system can include a plurality of processor chiplets, an input/output module and an interposer. Each of the plurality of processor chiplets can include a plurality of memory dice coupled to a respective logic die. The interposer can be configured to couple each processor chiplet to one or more others of the plurality of processor chiplets. The interposer can also be configured to couple each processor chiplet to the input/output module. The interposer can also be configured to couple the input/output module to a plurality of external contacts of the processing system.

In another embodiment, a processing system can include a plurality of processor chiplets and an active interposer. Each of the plurality of processor chiplets can include a plurality of memory dice coupled to a respective logic die. The active interpose can include input/output circuits. The active interposer can be configured to couple each processor chiplet to one or more others of the plurality of processor chiplets. The active interposer can also be configured to couple the plurality of processor chiplets to the input/output circuits. The active interposer can also be configured to the input/output circuits to a plurality of external contacts of the processing system.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 1A and 1B show a high bandwidth memory (HBM) based processing near memory (PNM) solution, according to the conventional art.

FIG. 2 shows a HBM based PNM interconnection solution, according to the conventional art.

DETAILED DESCRIPTION OF THE INVENTION

Figure 3:
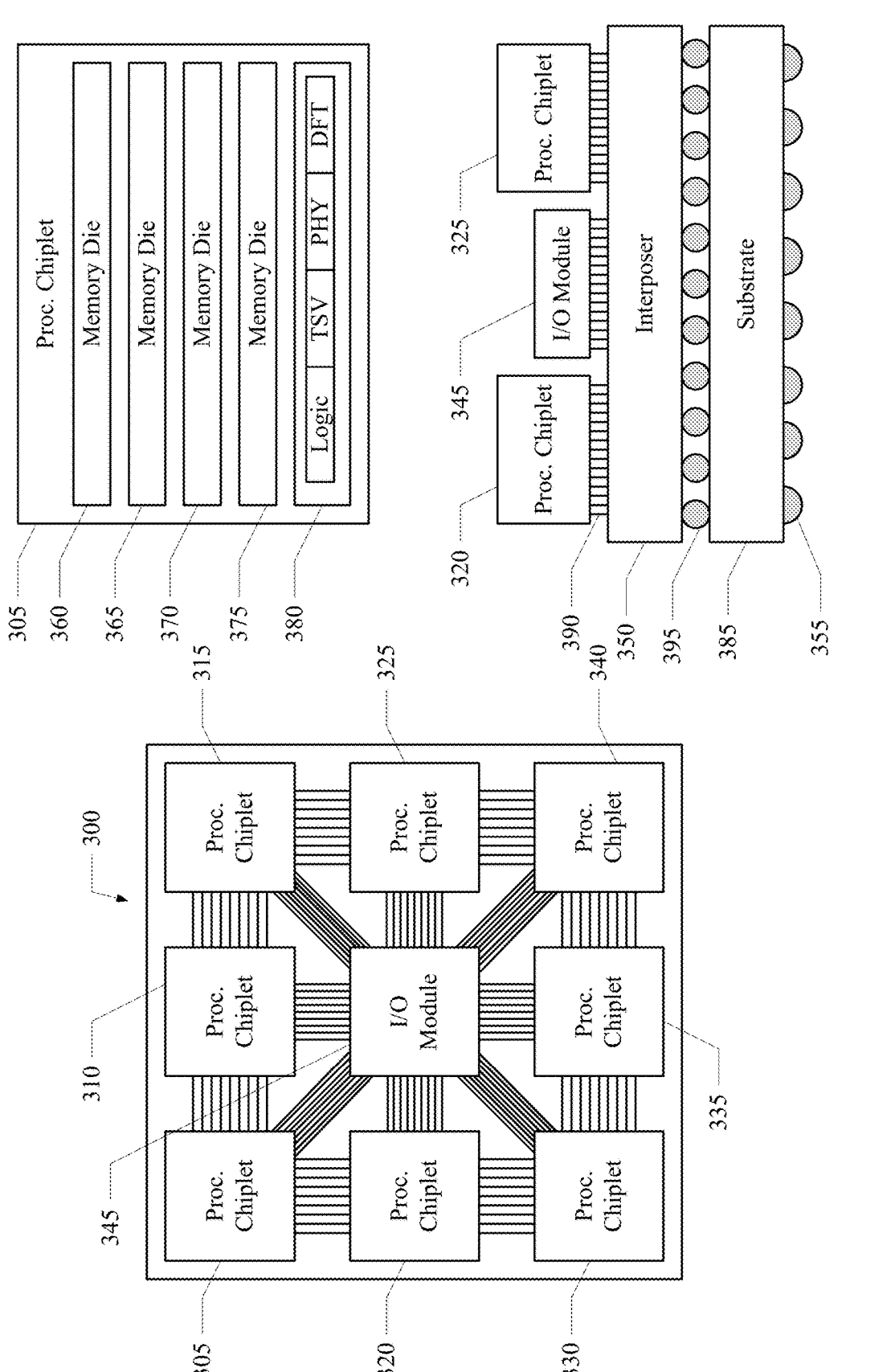
FIG. 3 shows a processing system, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Referring to FIG. 3, a processing system, in accordance with aspects of the present technology, is shown. The processing system 300 can include a plurality of processor chiplets 305-340, an input/output module 345 and an interposer 350. The interposer 350 can couple each processor chiplet 305-340 to one or more others of the plurality of processor chiplets 305-340. The interposer 350 can also couple the plurality of processor chiplets 305-340 to the input/output module 345. The interposer 350 can also couple the input/output module 345 to a plurality of external contacts 355 of the processing system 300. In one implementation, the plurality of processor chiplets can be a plurality of processing near memory (PNM) chiplets, a plurality of plurality of processor and close-memory structures, or the like. The chiplets can be an integrated circuit die and or a set of integrated circuit dice that have been designed to work with other similar chiplets to form a larger more complex chip. In processing near memory or close-memory, the memory and logic are incorporated in an integrated circuit package. In one implementation, the input/output module can be an input/output chiplet. In one implementation, the plurality of processor chiplets, the input/output module and the interposer can be embodied in a system-in-package (SiP), multi-chip module (MCM, chip stack or the like.

Each processor chiplet 305-340 can include a plurality of memory dice 360-375 coupled to a respective logic die 380. The plurality of memory dice 360-375 and respective logic die 380 can be implemented in a three-dimensional (3D) die stack. In one implementation, the memory dice 360-375 can be random access memory (RAM) dice, such as but not limited to DDR3, DDR4, GDDR5, or the like. In one implementation, each memory die 360-375 can include a plurality of memory blocks, in each of a plurality of memory channels. For example, a memory die 360 can include eight blocks in each of two memory channels. In addition, the banks can be further organized into sub-banks. In one implementation, each memory die 360-375 may be organized as a respective memory slice. In one implementation, the plurality of memory dice 360-375 and respective logic die 380 can implement a high bandwidth memory (HBM). In another implementation, the plurality of memory dice 360-375 and respective logic die 380 can implement a hybrid memory cube (HMC). In a non-limiting example, a HBM 3D stacked device can include 4 to 8 memory dice of 2, 4 or 8 GB. The exemplary HBM 3D stacked device can achieve 1 to 2 Gbps per pin, with a bandwidth of 128 to 256 Gbps. The respective logic dice 380 can include computation logic. For example, the respective logic dice 380 can implement one or more processing units, one or more graphics processing units, one or more encoder/decoder engines, one or more artificial intelligence (AI) engines, one or more digital signal processors (DSP) and or the like. Each logic die 380 can further include a through-silicon-via area, a physical layer, a design for test (DFT) area and or the like.

In one implementation, the plurality of memory dice 360-375 can be coupled together by through-silicon-vias (TSV) or a combination of through-silicon-vias and microbump array (uBUMP). In one implementation, the plurality of memory dice 360-375 can be further coupled to the respective logic die 380 by the through-silicon-vias or a combination the through-silicon-vias and microbump array (uBUMP). The through-silicon-vias or a combination the through-silicon-vias and microbump array (uBUMP) can also provide supply potentials to the plurality of memory dice 360-375. For example, the through-silicon-vias can couple a 1.2 Volt (V) external supply potential to the plurality of memory die 360-375.

The input/output module 345 can be configured to provide one or more communication interfaces. For example, the input/output module 345 can provide one or more peripheral component interface express (PCIe) interfaces, one or more double data rate (DDR) interfaces, one or more opensource interfaces and or the like. The input/output module 345 can be configured to provide 1024 bits of data access to the plurality of processor chiplets 305-340, and an access granularity of 256 Bytes. In one implementation, the input/output module 345 and the processor chiplets 305-340 can be coupled together in a mesh network topology. In other implementations, the input/output module 345 and the processor chiplets 305-340 can be coupled together in a star, ring, bus, daisy chain or other similar topology. In one implementation, each processor chiplet 305-340 can be directly connected to the input/output module 345 by the interposer 350. The interposer 350 can also directly connect the plurality of processor chiplets 305-340 to the input/output module 345. The input/output module 345 can further include computation logic, such as be not limited to, one or more host controllers, one or more arbitration engines, one or more design for test (DFT) engines, one or more data compression engines, one or more error correction code engines, and or the like.

In one implementation, the plurality of processor chiplets 305-340 can be the same size, the plurality of memory dice 360-375 can have the same memory density, and the logic die 380 can provide the same functions. In such an implementation, the processing system 300 can be homogeneous. In another implementation, the plurality of processor chiplets 305-340 can be different sizes, or subsets of processor chiplets can be different sizes. For example, the processor chiplets can include memory dice 360-375 with different memory densities, and or logic dies 380 can perform different functions or a subset of functions differ between the logic die 380 of different processor chiplets. In such implementation, the processing system 300 are be heterogeneous.

The processing system 300 can further include a substrate 385 configured to couple the processing system 300 to one or more other circuits. The substrate 385 can include a first set of ball array contacts 390 for coupling to the interposer 350, and a second set of ball array contacts 355 for coupling to the one or more other circuits, chips, modules, devices or the like.

Figure 4:
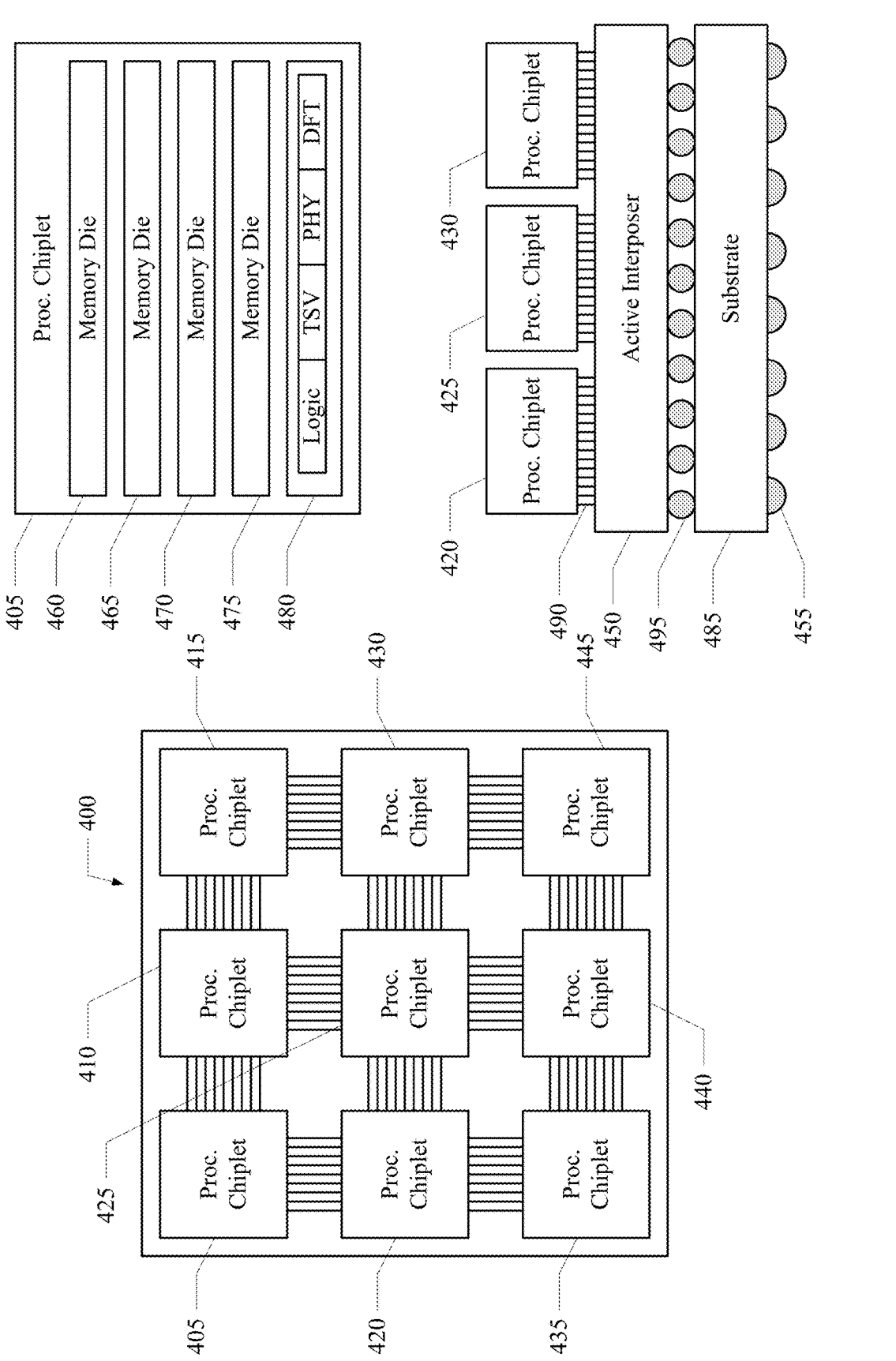
FIG. 4 shows a processing system, in accordance with aspects of the present technology.

Referring now to FIG. 4, a processing system, in accordance with aspects of the present technology, is shown. The processing system 400 can include a plurality of processor chiplets 405-445 and an active interposer 450. The active interposer 450 can include input/output circuitry. The active interposer 450 can couple each processor chiplet 405-445 to one or more others of the plurality of processor chiplets 405-445. The input/output circuitry of the active interposer 450 can be coupled to the plurality of processor chiplets 405-445. The input/output circuitry of the active interposer 450 can also be coupled to a plurality of external contacts 455 of the processing system 400. In one implementation, the plurality of processor chiplets can be a plurality of processing near memory (PNM) chiplets, a plurality of plurality of processor and close-memory structures, or the like. The chiplets can be an integrated circuit die and or a set of integrated circuit dice that have been designed to work with other similar chiplets to form a larger more complex chip. In processing near memory or close-memory, the memory and logic are incorporated in an integrated circuit package. In one implementation, the input/output module can be an input/output chiplet. In one implementation, the plurality of processor chiplets and the active interposer including the input/output circuitry can be embodied in a system-in-package (SiP), multi-chip module (MCM), chip stack or the like.

Each processor chiplet 405-445 can include a plurality of memory dice 460-475 coupled to a respective logic die 480. The plurality of memory dice 460-475 and respective logic die 480 can be implemented in a three-dimensional (3D) die stack. In one implementation, the memory dice 460-475 can be random access memory (RAM) dice, such as but not limited to DDR3, DDR4, GDDR5, or the like. In one implementation, each memory die 460-475 can include a plurality of memory blocks, in each of a plurality of memory channels. For example, a memory die 460 can include eight blocks in each of two memory channels. In addition, the banks can be further organized into sub-banks. In one implementation, each memory die 460-475 may be organized as a respective memory slice. In one implementation, the plurality of memory dice 460-475 and respective logic die 480 can implement a high bandwidth memory (HBM). In another implementation, the plurality of memory dice 460-475 and respective logic die 480 can implement a hybrid memory cube (HMC). In a non-limiting example, a HBM 3D stacked device can include 4 to 8 memory dice of 2, 4 or 8 GB. The exemplary HBM 3D stacked device can achieve 1 to 2 Gbps per pin, with a bandwidth of 128 to 256 Gbps. The respective logic dice 480 can include computation logic. For example, the respective logic dice 480 can implement one or more processing units, one or more graphics processing units, one or more encoder/decoder engines, one or more artificial intelligence (AI) engines, one or more digital signal processors (DSP) and or the like. Each logic die 480 can further include a through-silicon-via area, a physical layer, a design for test (DFT) area and or the like.

In one implementation, the plurality of memory dice 460-475 can be coupled together by through-silicon-vias (TSV) or a combination of through-silicon-vias and microbump array (uBUMP). In one implementation, the plurality of memory dice 460-475 can be further coupled to the respective logic die 480 by the through-silicon-vias or a combination the through-silicon-vias and microbump array (uBUMP). The through-silicon-vias or a combination the through-silicon-vias and microbump array (uBUMP) can also provide supply potentials to the plurality of memory dice 460-475. For example, the through-silicon-vias can couple a 1.2 Volt (V) external supply potential to the plurality of memory die 460-475.

The input/output circuitry of the active interposer 450 can be configured to provide one or more communication interfaces. For example, the input/output circuitry can provide one or more peripheral component interface express (PCIe) interfaces, one or more double data rate (DDR) interfaces, one or more opensource interfaces and or the like. The input/output circuitry of the active interposer 450 can be configured to provide 1024 bits of data access to the plurality of processor chiplets 405-445, and an access granularity of 256 Bytes. In one implementation, the input/output circuitry of the active interposer 450 and the processor chiplets 405-445 can be coupled together in a mesh network topology. In a mesh topology, the input/output circuitry and each processor chiplets 405-445 can be directly coupled together, dynamically and non-hierarchically to as many others as possible and cooperate with one another to efficiently route data, instructions, control signals and the like. In other implementations, the input/output circuitry and the processor chiplets 405-445 can be coupled together in a star, ring, bus, daisy chain or other similar topology. The input/output circuitry of the active interposer 450 can further include computation logic, such as be not limited to, one or more host controllers, one or more arbitration engines, one or more design for test (DFT) engines, one or more data compression engines, one or more error correction code engines, and or the like.

In one implementation, the plurality of processor chiplets 405-445 can be the same size, the plurality of memory dice 460-475 can have the same memory density, and the logic die 480 can provide the same functions. In such an implementation, the processing system 400 can be homogeneous. In another implementation, the plurality of processor chiplets 405-445 can be different sizes, or subsets of processor chiplets can be different sizes. For example, the processor chiplets can include memory dice 460-475 with different memory densities, and or logic dies 480 can perform different functions or a subset of functions differ between the logic die 480 of different processor chiplets. In such implementation, the processing system 400 are be heterogeneous.

The processing system 400 can further include a substrate 485 configured to couple that processing system 400 to one or more other circuits. The substrate 485 can include a first set of ball array contacts 490 for coupling to the interposer 450, and a second set of ball array contacts 455 for coupling to the one or more other circuits, chips, modules, devices or the like. In one implementation, fine-pitch ball grid array (FBGA) contacts 495 can be utilized for coupling to the active interposer 450 to the substrate 485. Ball grid array (BGA) contacts 455 can be utilized for coupling the substrate 485 to one or more other circuits, chips, modules, devices or the like.

In accordance with aspects of the present technology, the through-silicon-via coupling of the plurality of memory dice and one or more logic die can advantageously provides a high bandwidth communication channel. For example, in a processing system in accordance with aspects of the present technology, a 1024 Gbps or 256 GBps bandwidth can be achieved. In comparison, the bandwidth of DDR3 memory cards is limited to 8-64 Gbps. The through-silicon-via coupling of the plurality of memory dice and one or more logic die can also advantageously provide a high memory capacity by overcoming scaling limitations in the memory by stacking the memory dice. For example, a processing system utilizing a three-dimensional die stack can achieve 128 GB of memory capacity. In comparison, DDR3 memory cards are limited to 16 GB. Similarly, processing systems in accordance with aspects of the present technology can also advantageously provide a small form factor. For example, a 42 mm² package size can be achieved for a processing system utilizing through-silicon-via coupling in a 3D memory die stack. In comparison, a 3D memory stack utilizing wirebonding has a package size of 117 mm². Processing systems in accordance with aspects of the present technology can also advantageously provide improved power efficiency. For example, a processing system utilizing through-silicon-via can consume 3.3 Watts (W) while operating at 128 GB/s. In comparison, 3D memory stack utilizing wirebonding can consume 6.4 W. Aspects of the present technology also advantageously support higher memory capacity and inter die communication.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A processing system comprising:

a plurality of processor chiplets, each processor chiplet including a plurality of memory dice coupled to a respective logic die;

an input/output module; and an interposer coupling each processor chiplet to one or more others of the plurality of processor chiplets, the plurality of processor chiplets to the input/output module, and the input/output module to a plurality of external contacts of the processing system.

2. The processing system of claim 1, wherein the plurality of memory dice and the respective logic die of each processor chiplet are disposed in a three-dimension (3D) stack.

3. The processing system of claim 1, wherein the plurality of processor chiplets and the input/output module are coupled together in a mesh topology by the interposer.

4. The processing system of claim 1, wherein each processing chiplet is directly coupled to the input/output module by the interposer.

5. The processing system of claim 1, further comprising a substrate coupling the plurality of processing chiplets, the input/output module and the interposer to the plurality of external contacts of the processing system.

6. The processing system of claim 1, wherein the plurality of processor chiplets comprise a plurality of processor near-memory (PNM) chiplets.

7. The processing system of claim 1, wherein the plurality of processor chiplets comprise a plurality of processors and close-memory structures.

8. The processing system of claim 1, wherein the plurality of processor chiplets, the input/output module and the interposer are a system-in-package (SiP).

9. The processing system of claim 1, wherein the input/output module comprises an input/output chiplet.

10. A processing system comprising:

a plurality of processor chiplets, each processor chiplet including a plurality of memory dice coupled to a respective logic die; and an active interposer including input/output circuits, wherein the active interposer couples each processor chiplet to one or more others of the plurality of processor chiplets, the plurality of processor chiplets to the input/output circuits, and the input/output circuits to a plurality of external contacts of the processing system.

11. The processing system of claim 10, wherein the plurality of memory dice and the respective logic die of each processor chiplet are disposed in a three-dimension (3D) stack.

12. The processing system of claim 10, wherein the plurality of processor chiplets and the input/output circuits of the active interposer are coupled together in a mesh topology by the active interposer.

13. The processing system of claim 10, wherein each processor chiplet is directly coupled to the input/output circuits of the active interposer.

14. The processing system of claim 10, wherein the active interposer is coupled to a substrate by a fine-pitch ball grid array (FBGA).

15. The processing system of claim 10, wherein the plurality of external contacts of the processing system comprise a ball grid array (BGA) disposed on a substrate.

16. The processing system of claim 10, wherein the plurality of memory dice and the respective logic die in each processor chiplet are coupled together by through-silicon-vias (TSV).

17. The processing system of claim 16, wherein an external supply potential is coupled to the plurality of memory dice in each processor chiplet by the through-silicon-vias (TSV).

18. The processing system of claim 10, wherein the plurality of memory dice and the respective logic die in each processor chiplet are coupled together by a combination of through-silicon-vias (TSV) and microbump arrays (uBUMP).

19. The processing system of claim 18, wherein an external supply potential is coupled to the plurality of memory dice in each processor chiplet by the through-silicon-vias (TSV).

20. The processing system of claim 10, wherein the respective logic die of each processor chiplet are coupled to the active interposer by a microbump array (uBUMP).

* * * * *